United States Patent
Nonin et al.

(10) Patent No.: US 9,548,777 B2
(45) Date of Patent: Jan. 17, 2017

(54) RECEPTION DEVICE AND RECEPTION METHOD

(71) Applicant: KABUSHIKI KAISHA TOSHIBA, Tokyo (JP)

(72) Inventors: Katsuya Nonin, Kawasaki Kanagawa (JP); Kentaro Taniguchi, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 98 days.

(21) Appl. No.: 14/475,420

(22) Filed: Sep. 2, 2014

(65) Prior Publication Data

US 2015/0222240 A1    Aug. 6, 2015

(30) Foreign Application Priority Data

Feb. 6, 2014    (JP) ................................. 2014-021471

(51) Int. Cl.
*H04B 1/06* (2006.01)
*H04B 1/12* (2006.01)
*H03G 3/30* (2006.01)

(52) U.S. Cl.
CPC ............ *H04B 1/123* (2013.01); *H03G 3/3052* (2013.01); *H03G 3/3073* (2013.01); *H03G 3/3078* (2013.01)

(58) Field of Classification Search
CPC .. H03G 3/3052; H03G 3/3073; H03G 3/3078; H04B 1/123; H04B 1/109; H04B 1/30; H04W 52/52
USPC ................... 455/239.1, 240.1, 241.1, 242.1, 245.1, 455/250.1
See application file for complete search history.

(56) References Cited

U.S. PATENT DOCUMENTS

| 2001/0028275 | A1* | 10/2001 | Matsugatani | ........ | H03G 3/3078 330/281 |
| 2003/0027538 | A1* | 2/2003 | Masumoto | ........... | H03G 3/3068 455/234.1 |
| 2010/0128826 | A1* | 5/2010 | Imamura | .............. | H03G 3/3068 375/345 |
| 2012/0319774 | A1* | 12/2012 | Ibrahim | ............... | H03G 3/3068 330/129 |

FOREIGN PATENT DOCUMENTS

JP    2006-109200 A    4/2006

* cited by examiner

*Primary Examiner* — Yuwen Pan
*Assistant Examiner* — Fatuma Sherif
(74) *Attorney, Agent, or Firm* — Patterson & Sheridan, LLP

(57) ABSTRACT

A reception device includes a low noise amplifier that amplifies a radio signal by a first gain, a variable gain amplifier that amplifies an output of the low noise amplifier by a second gain, an analog-to-digital converter that converts an output of the variable gain amplifier into a digital signal, a gain controller, and a saturation detection unit. The gain controller, when an amplitude of the radio signal exceeds a predetermined value, controls the first and second gains according to the amplitude of the radio signal, and completes the control within a predetermined period. The saturation detection unit detects saturation of the analog-to-digital converter based on the output of the low noise amplifier or the digital signal. The gain controller, after controlling the first and second gains a first time and the saturation is detected by the saturation detection unit, controls the first and second gains a second time.

14 Claims, 8 Drawing Sheets

(COMPARISON EXAMPLE)

RECEPTION DEVICE AND RECEPTION METHOD

CROSS-REFERENCE TO RELATED APPLICATION

This application is based upon and claims the benefit of priority from Japanese Patent Application No. 2014-021471, filed Feb. 6, 2014, the entire contents of which are incorporated herein by reference.

FIELD

Embodiments described herein relate to a reception device and a reception method.

BACKGROUND

In general, a reception device which receives a radio signal performs signal processing by amplifying a received radio signal at an appropriate gain. In such a reception device, a gain corresponding to an amplitude of a radio signal is controlled when the amplitude of the radio signal exceeds a threshold value. The controlling is usually completed within a period of a preamble contained in the radio signal. In such a reception device, when an interference wave is received before the radio signal is received, the reception performance for the desired wave (i.e., the received radio signal) deteriorates.

DESCRIPTION OF THE DRAWINGS

FIG. 4(a) and FIG. 4 (b) are waveform charts, in which FIG. 4(a) is a waveform chart that illustrates a waveform of a radio signal received by an antenna of the reception device illustrated in FIG. 1, and FIG. 4(b) is a waveform chart that illustrates a waveform of a digital signal based on the radio signal illustrated in FIG. 4(a).

FIG. 6(a) and FIG. 6(b) are waveform charts, in which FIG. 6(a) is a waveform chart that illustrates a waveform of a radio signal input to an antenna of the reception device illustrated in FIG. 5, and FIG. 6(b) is a waveform chart that illustrates a waveform of a digital signal based on the radio signal illustrated in FIG. 6(a).

DETAILED DESCRIPTION

In one or more embodiments, a reception device and a reception method are provided, where the reception device and reception method prevent deterioration of reception performance.

In one embodiment, a reception device comprises a low noise amplifier that amplifies a radio signal received by an antenna by a first gain, a variable gain amplifier that amplifies an output signal of the low noise amplifier by a second gain, and an analog-to-digital converter that converts an output signal of the variable gain amplifier into a digital signal. The reception device further comprises a gain controller that, when an amplitude of the radio signal exceeds a predetermined threshold value, controls the first gain and the second gain corresponding to the amplitude of the radio signal, and completes the controlling within a predetermined gain control period. Further, the reception device comprises a saturation detection unit that detects saturation of the analog-to-digital converter based on the output signal of the low noise amplifier or the digital signal, where the gain controller, after controlling the first gain and the second gain a first time and the saturation is detected by the saturation detection unit, controls the first gain and the second gain a second time based on the amplitude of the radio signal.

Hereinafter, embodiments of the present disclosure are explained with reference to the drawings. One or more other embodiments that are not depicted are contemplated.

First Embodiment

Figure 1:
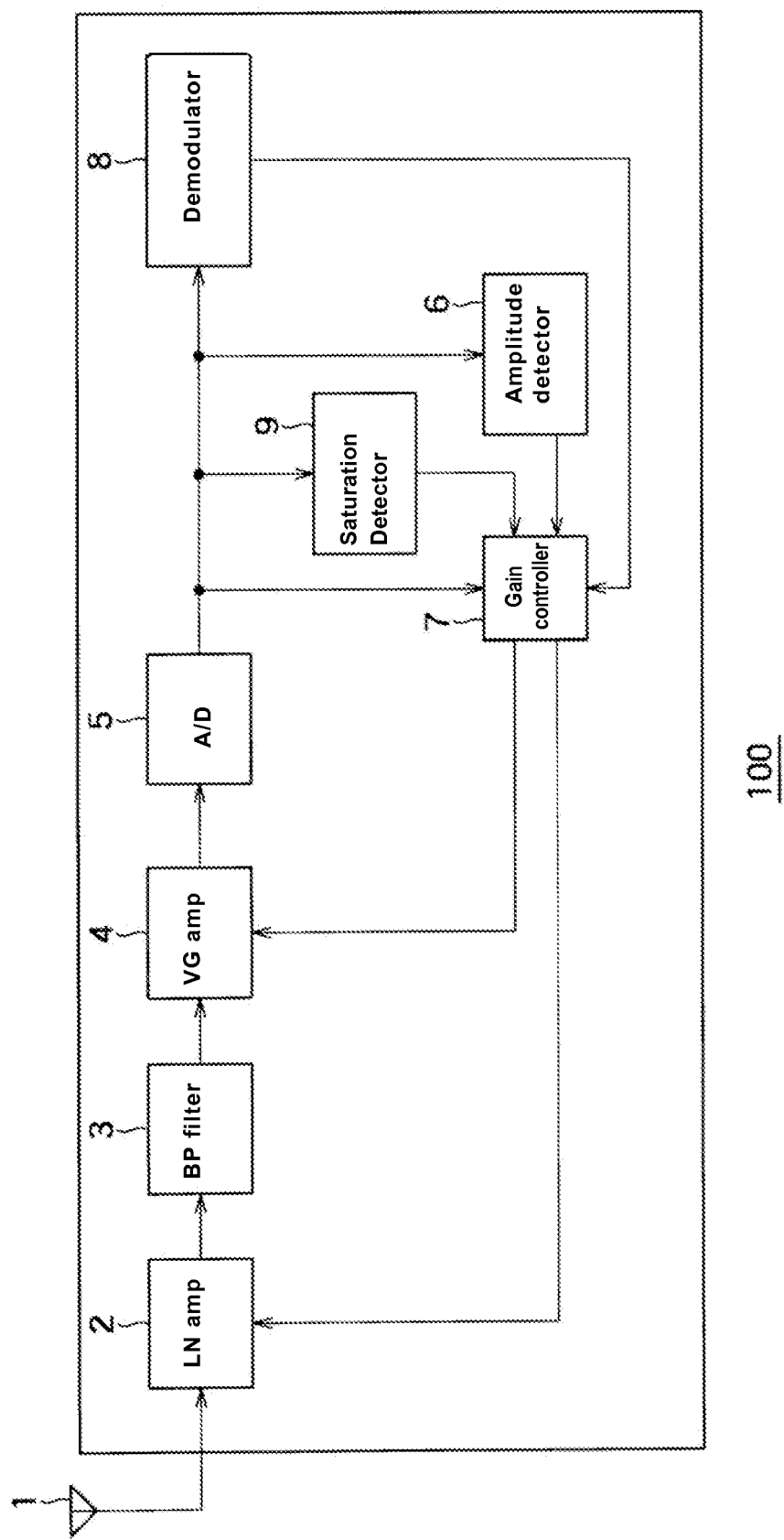
FIG. 1 is a conceptual diagram illustrating a configuration of a reception device according to a first embodiment.

FIG. 1 is a block diagram illustrating a configuration of a reception device 100 according to a first embodiment. As illustrated in FIG. 1, the reception device 100 includes: an antenna 1; a low noise amplifier (LNA) 2; a band pass filter (BPF) 3; a variable gain amplifier (VGA) 4; an analog-to-digital converter (ADC) 5; an amplitude detection unit 6; an automatic gain controller (AGC) 7; a demodulation unit 8; and a saturation detection unit 9. The reception device 100 operates, in embodiments, in conformance with the Bluetooth Low Energy (BLE)standard.

The antenna 1 receives a radio signal. The radio signal is a signal within a radio frequency band (e.g., a signal within a band of 2.4 GHz).

Figure 2:
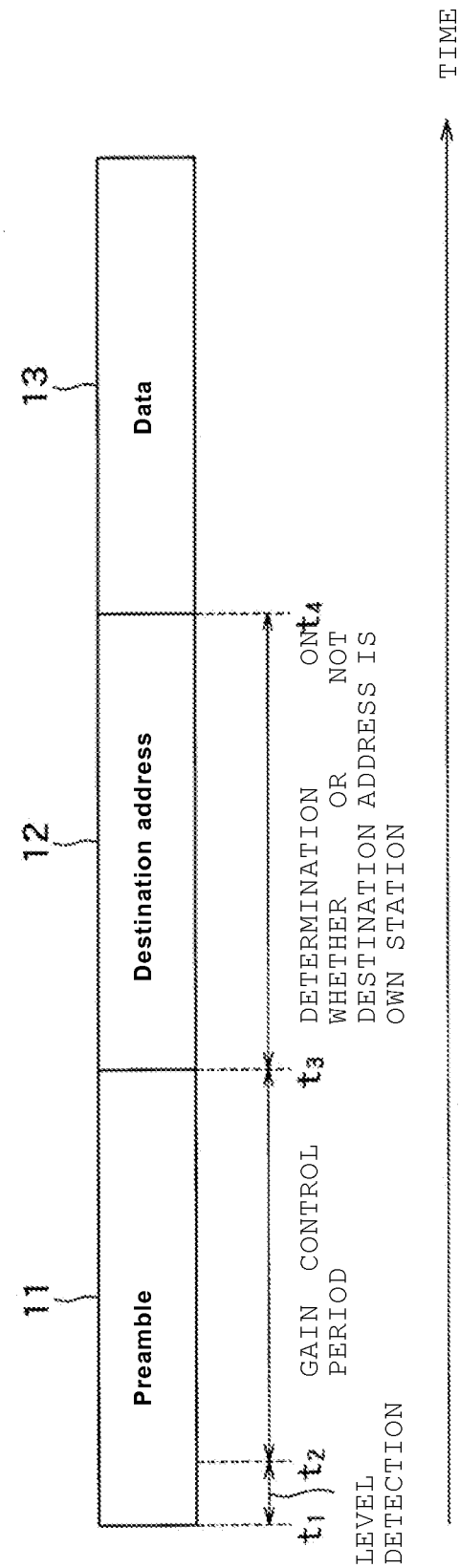
FIG. 2 is a conceptual diagram illustrating a frame format of a radio signal received by the reception device of FIG. 1.

FIG. 2 is a conceptual diagram illustrating a frame format of a radio signal which the reception device 100 illustrated in FIG. 1 receives. As illustrated in FIG. 2, the radio signal contains a preamble 11, a destination address 12, and data 13, in this order. The destination address 12 is an address to which data 13 is addressed, where a destination address is allocated for each reception device 100.

The low noise amplifier 2 amplifies a radio signal received by the antenna 1 at a first gain. The first gain is variable and is set by the automatic gain controller 7.

The band pass filter 3 removes undesired frequency components from an output signal of the low noise amplifier 2, and outputs desired frequency components.

The variable gain amplifier 4 amplifies an output signal of the low noise amplifier 2, which passes through the band pass filter 3, by a second gain. The second gain is variable and is set by the automatic gain controller 7.

The analog-to-digital converter 5 converts an output signal of the variable gain amplifier 4 into a digital signal.

The amplitude detection unit 6 detects whether or not the amplitude (i.e., level) of a radio signal exceeds a predetermined threshold value based on a digital signal from the analog-to-digital converter 5. This is usually referred to as "level detection." As illustrated in FIG. 2, the level detection is performed from a first point in time t1 to a point in time t2 of the preamble 11.

In response to detection by the amplitude detection unit 6, the automatic gain controller 7, when the amplitude of the radio signal exceeds a predetermined threshold value, controls a first gain and a second gain corresponding to the amplitude of the radio signal, and finishes the controlling within a predetermined gain control period. To be more specific, the automatic gain controller 7 sets the first gain and the second gain such that the smaller the amplitude of a radio signal is, the larger a sum of the first gain and the second gain becomes.

As illustrated in FIG. 2, the gain control period (from a point in time t2 to t3) is shorter than a period of the preamble 11 (which extends from times t1 to t3). Accordingly, the control of the first gain and the second gain completes within the period of the preamble 11. That is, at the point in time t3 where the period of the preamble 11 is finished, the first gain and the second gain are set to optimal values. The reason such a control is performed is that when the first gain and the second gain are controlled, even during a period of the destination address 12 (which follows the period of the preamble 11), the amplitude of the digital signal fluctuates and, hence, the demodulation unit 8 does not accurately determine the destination address 12.

The demodulation unit 8 acquires the destination address 12 and the data 13 by demodulating the digital signal. As illustrated in FIG. 2, the demodulation unit 8 determines whether or not the destination address 12 which the demodulation unit 8 acquires during the period of the destination address 12 (from a point of time t3 to a point of time 4) is an address addressed of the "own device" (i.e., the reception device 100). The demodulation unit 8 acquires the data 13 after the point in time t4.

The saturation detection unit 9 detects saturation of the analog-to-digital converter 5 based on the digital signal. In embodiments, the saturation detection unit 9 detects the saturation of the analog-to-digital converter 5 when the digital signal reaches a maximum value a predetermined number of times, or when the digital signal exceeds a predetermined saturation detection threshold value. The saturation of the analog-to-digital converter 5 means that an output signal of the variable gain amplifier 4 is larger than an input allowable range of the analog-to-digital converter 5, and a digital signal from the analog-to-digital converter 5 reaches a maximum value (i.e., saturates).

After the control of the first gain and the second gain has completed once, the automatic gain controller 7, when the demodulation unit 8 does not acquire a destination address 12 corresponding to the own device, and when the saturation is detected by the saturation detection unit 9, re-controls the first gain and the second gain corresponding to the amplitude of a radio signal. The automatic gain controller 7 completes the re-control within a gain control period.

To be more specific, after completing control of the first gain and second gain, the automatic gain controller 7 changes the first gain and the second gain in accordance with a predetermined control rule, such that an amplitude of the digital signal approximates a target value. The automatic gain controller 7 performs the changes when the amplitude of the radio signal exceeds a threshold value, when the demodulation unit 8 does not acquire a destination address 12 that corresponds to the own device, and when the saturation detection unit 9 detects the saturation. That is, the automatic gain controller 7 controls the first gain and the second gain in accordance with the control rule both the time of controlling the first gain and the second gain, and at the time of re-controlling the first gain and the second gain.

According to one or more embodiments, the first gain is variable in four stages, and a change width of the first gain is relatively large. Further, the second gain is variable in four stages, and a change width of the second gain is smaller than the change width of the first gain.

Although any control rule may be used, the rough adjustment of the first gain is performed in one or more embodiments by gradually lowering the first gain from the maximum gain until the amplitude of the digital signal approximates a target value. After the first gain is fixed, the fine adjustment of the second gain is performed by gradually lowering the second gain from a maximum gain until the amplitude of the digital signal approximates the target value.

Next, an embodiment of the reception device 100 is explained in more detail with reference to FIG. 3 and FIG. 4.

Figure 3:
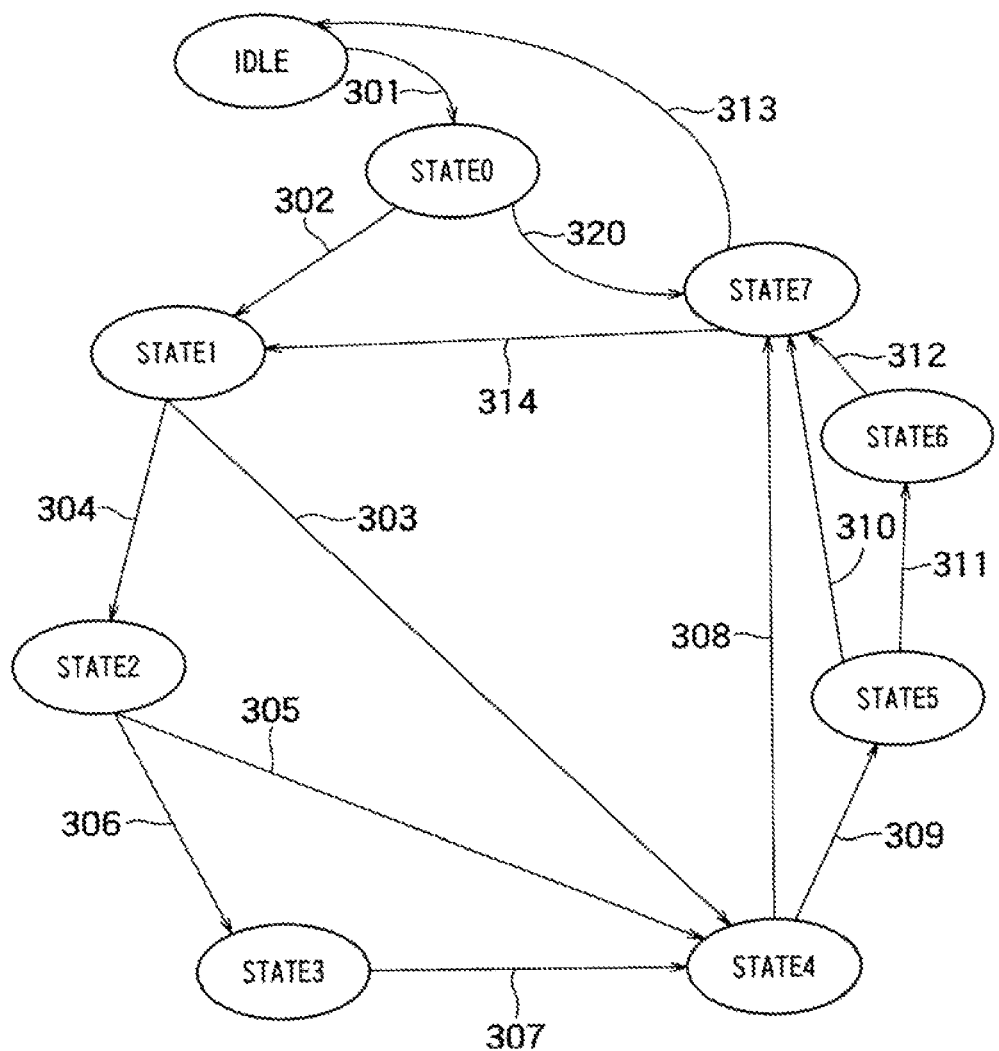
FIG. 3 is a state transition diagram of the reception device illustrated in FIG. 1.
Figure 4:
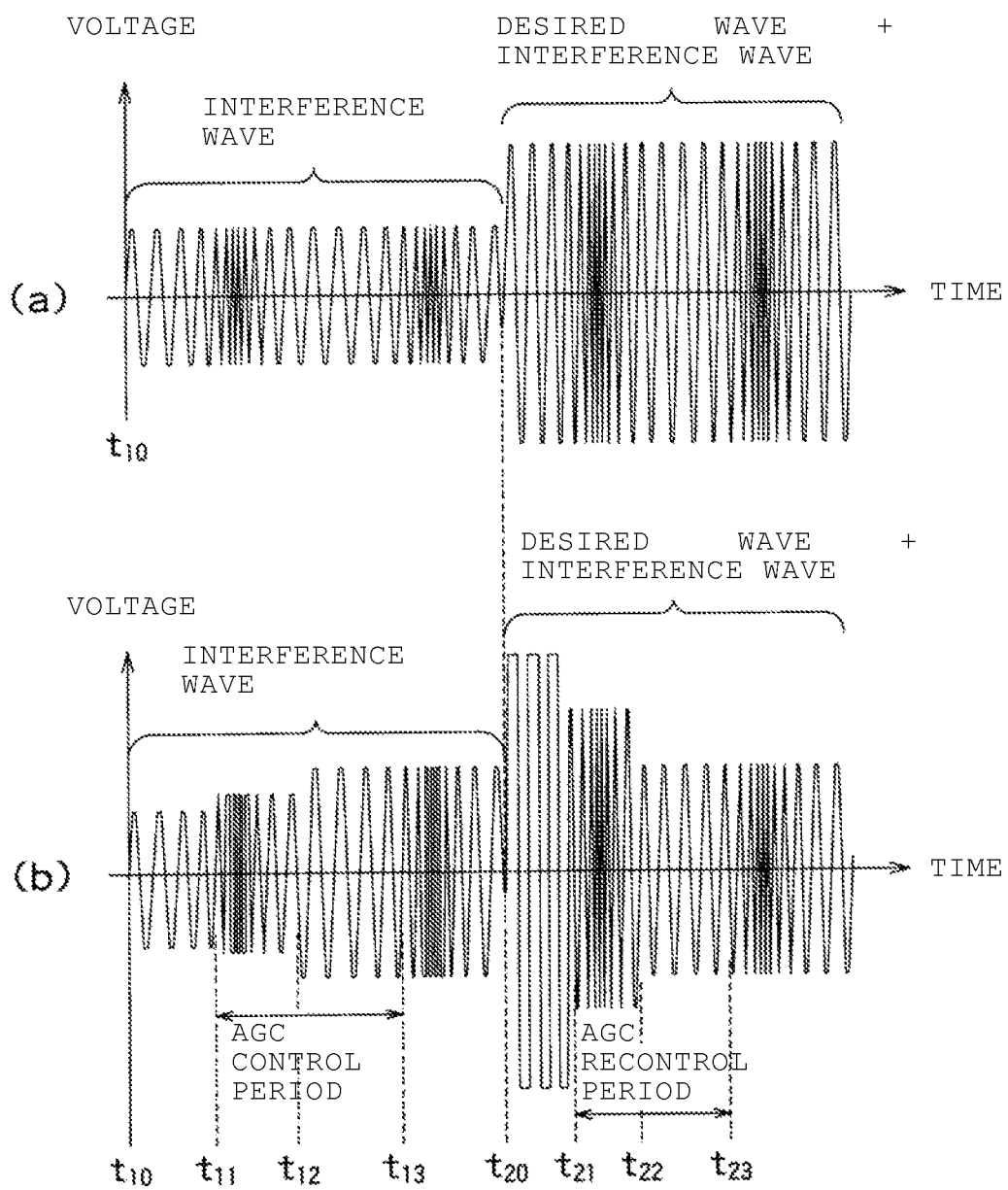

FIG. 3 is a state transition diagram illustrating the reception device 100 in FIG. 1. An initial state is an IDLE state, where the operation of the reception device 100 is stopped. When a reception starting instruction is input to the reception device 100 from the outside, the reception device 100 transitions to a STATE0, where the reception operation (i.e., standby operation) is performed (301).

In STATE0, for example, the first gain and the second gain are set to the largest gain. When the amplitude of a radio signal exceeds a threshold value (i.e., when an edge of the radio signal is detected), the reception device 100 transitions to STATE1 (302). On the other hand, when the amplitude of the radio signal is smaller than the threshold value (i.e., when the edge of the radio signal is not detected), and when the destination address 12 is acquired, the reception device 100 transitions to a STATE7, while maintaining the first gain and the second gain at the largest gain (320).

In STATE1, when the amplitude of the digital signal falls within a first predetermined value from a target value, the automatic gain controller 7 determines that the optimal first gain is the largest gain, and the reception device 100 transitions to a STATE4 (303). On the other hand, when the amplitude of the digital signal differs from the target value by the first predetermined value or more, the automatic gain controller 7 sets the first gain to a first intermediate gain lower than the largest gain, and the reception device 100 transitions to STATE2 (304).

In STATE2, when the amplitude of the digital signal falls within a first predetermined value from a target value, the automatic gain controller 7 determines that the optimal first gain is the first intermediate gain, and the reception device 100 transitions to STATE4 (305). On the other hand, when the amplitude of the digital signal differs from the target value by the first predetermined value or more, the automatic gain controller 7 sets the first gain to a second intermediate gain that is lower than the first intermediate gain, and the reception device 100 transitions to a STATE3 (306).

In STATE3, when the amplitude of the digital signal falls within a first predetermined value from a target value, the automatic gain controller 7 determines that the optimal first gain is the second intermediate gain, and the reception device 100 transitions to STATE4 (307). On the other hand, when the amplitude of the digital signal is away from the target value by the first predetermined value or more, the automatic gain controller 7 sets the first gain to a smallest gain that is lower than the second intermediate gain, and the reception device 100 transitions to STATE4 (307).

In STATE4, when the amplitude of the digital signal falls within a second predetermined value from a target value, the automatic gain controller 7 determines that the optimal second gain is the largest gain, and the reception device 100 transitions to STATE7 (308). For example, the second predetermined value is smaller than the first predetermined value. On the other hand, when the amplitude of the digital signal differs from the target value by the second predetermined value or more, the automatic gain controller 7 sets the second gain to the first intermediate gain that is lower than the largest gain, and the reception device 100 transitions to STATE5 (309).

In STATE5, when the amplitude of the digital signal falls within a second predetermined value from a target value, the automatic gain controller 7 determines that the optimal second gain is the first intermediate gain, and the reception device 100 transitions to STATE7 (310). On the other hand, when the amplitude of the digital signal is away from the target value by the second predetermined value or more, the automatic gain controller 7 sets the second gain to a second intermediate gain lower than the first intermediate gain, and the reception device 100 transitions to STATE6 (311).

In STATE6, when the amplitude of the digital signal falls within a second predetermined value from a target value, the automatic gain controller 7 determines that the optimal second gain is the second intermediate gain, and the reception device 100 transitions to STATE7 (312). On the other hand, when the amplitude of the digital signal is away from the target value by the second predetermined value or more, the automatic gain controller 7 sets the second gain to a smallest gain that is lower than the second intermediate gain, and the reception device 100 transitions to STATE7 (312).

In STATE7, the automatic gain controller 7 receives a radio signal in a state where the first gain and the second gain are fixed. When the reception of a radio signal is complete, the reception device 100 transitions to IDLE state (313). On the other hand, when the demodulation unit 8 does not acquire destination address 12 that is addressed to the own device, and the saturation is detected by the saturation detection unit 9 during a period when the automatic gain controller 7 receives the radio signal, the reception device 100 transitions to STATE1 (314), and the automatic gain controller 7 re-controls the first gain and the second gain.

FIG. 4(a) and FIG. 4(b) are waveform charts, in which FIG. 4(a) is a waveform chart illustrating a waveform of a radio signal received by the antenna 1 of the reception device 100 in FIG. 1, and FIG. 4(b) is a waveform chart illustrating a waveform of a digital signal based on the radio signal in FIG. 4(a).

As illustrated in FIG. 4(a), an interference wave is input to the antenna 1 at a point in time t10 and, thereafter, a desired wave having a larger amplitude than the interference wave is input (in addition to the interference wave) at a point in time t20. The desired waveform contains a destination address 12, which corresponds to the own device.

In embodiments, the interference wave may be a co-channel interference wave, or an adjacent channel interference wave generated by a similar communication system to embodiments, or an interference wave generated by another communication system. The co-channel interference wave contains data 13 which is not addressed to the own device. That is, the interference waves do not contain a destination address 12 corresponding to the own device. If the interference wave is generated by another communication system, such communication system may be a radio LAN which uses a radio signal of the same band of 2.4 GHz or the like is.

In the embodiment illustrated, the amplitude detection unit 6 detects that amplitude of a radio signal exceeds a threshold value on or after the point of time t10. Accordingly, as illustrated in FIG. 4(b), the first gain and the second gain are controlled within a gain control period (i.e., an AGC control period) from a point in time t11 to a point in time t13. In this example, a sum of the first gain and the second gain is increased at the point in time t11, and is further increased at the point in time t12. Accordingly, the amplitude of a digital signal approximates a target value and, hence, the control of the first gain and the second gain is finished. In this example, to facilitate the understanding of the present disclosure, a change in waveform from the point in time t11 to the point in time t13 is simplified, and the change does not conform to the control rule described previously.

Subsequently, when the desired waveform is also input in addition to the interference wave at the point in time t20, the amplitude which a digital signal expresses is saturated. That is, a waveform of a digital signal becomes a square waveform. Accordingly, the saturation detection unit 9 detects the saturation of the analog-to-digital converter 5. The destination address 12 corresponding to the own device is not acquired until this point of time.

Accordingly, in the gain control period (i.e., the AGC re-control period), extending from a point in time t21 to a point in time t23, the first gain and the second gain are re-controlled. In this example, a sum of the first gain and the second gain is decreased at the point in time t21, and is further decreased at the point in time t22. Accordingly, the amplitude of a digital signal approximates a target value and hence, the re-control of the first gain and the second gain is finished.

Here, the point in time t20 at which the analog-to-digital converter 5 is saturated is a head position of the preamble 11 of a desired waveform and, hence, even when the first gain and the second gain are re-controlled from the point in time t20, the control may be finished before the destination address 12 is received. Accordingly, a desired wave may be received normally.

In this manner, according to this embodiment, when the control of the first gain and the second gain is completed once, when the destination address 12 corresponding to the own device is not acquired, and when the saturation is detected, the first gain and the second gain are re-controlled. Accordingly, even when the first gain and the second gain are fixed once based on an interference wave which has smaller amplitude than a desired wave, the first gain and the second gain may be lowered at a point in time that the desired wave is received and, hence, the saturation of the analog-to-digital converter 5 may be prevented. Accordingly, the deterioration of a reception performance may also be prevented.

Further, when the destination address 12 corresponding to the own device is acquired, the first gain and the second gain are not re-controlled. Accordingly, after the control of the first gain and the second gain is completed once, amplitude of the desired wave is temporarily increased during the reception of the desired wave. When the analog-to-digital converter 5 is saturated due to the increase of the amplitude of the desired wave, the first gain and the second gain are not lowered. Once the re-control of the first gain and the second gain starts, the amplitude of a digital signal fluctuates within a gain control period and hence, data 13 is not accurately acquired. By contrast, according to this embodiment, when amplitude of the desired wave is decreased again, it is possible to acquire data 13 more accurately than the case where the first gain and the second gain are re-controlled.

In the case where the temporary increase of the amplitude of the desired wave during the reception of the desired wave is not taken into account, the automatic gain controller 7 may re-control the first gain and the second gain corresponding to the amplitude of a radio signal when the control of the first gain and the second gain has completed once, and the saturation detection unit 9 detects the saturation without using the destination address 12.

The control rule is not limited to the above-mentioned example, and other well-known control rules may be used. For example, the first gain may at first be increased from the smallest gain, and the second gain may be increased from the smallest gain after the first gain is determined.

A mixer which converts a frequency of an output signal of the low noise amplifier 2 into a low frequency may be provided between the low noise amplifier 2 and the band pass filter 3. Advantageous effects substantially equal to those mentioned above may also be obtained in such a configuration.

Comparison Example

Here, a reception device 100X of the comparison example is explained with reference to FIG. 5, FIG. 6(*a*), and FIG. 6(*b*).

Figure 5:
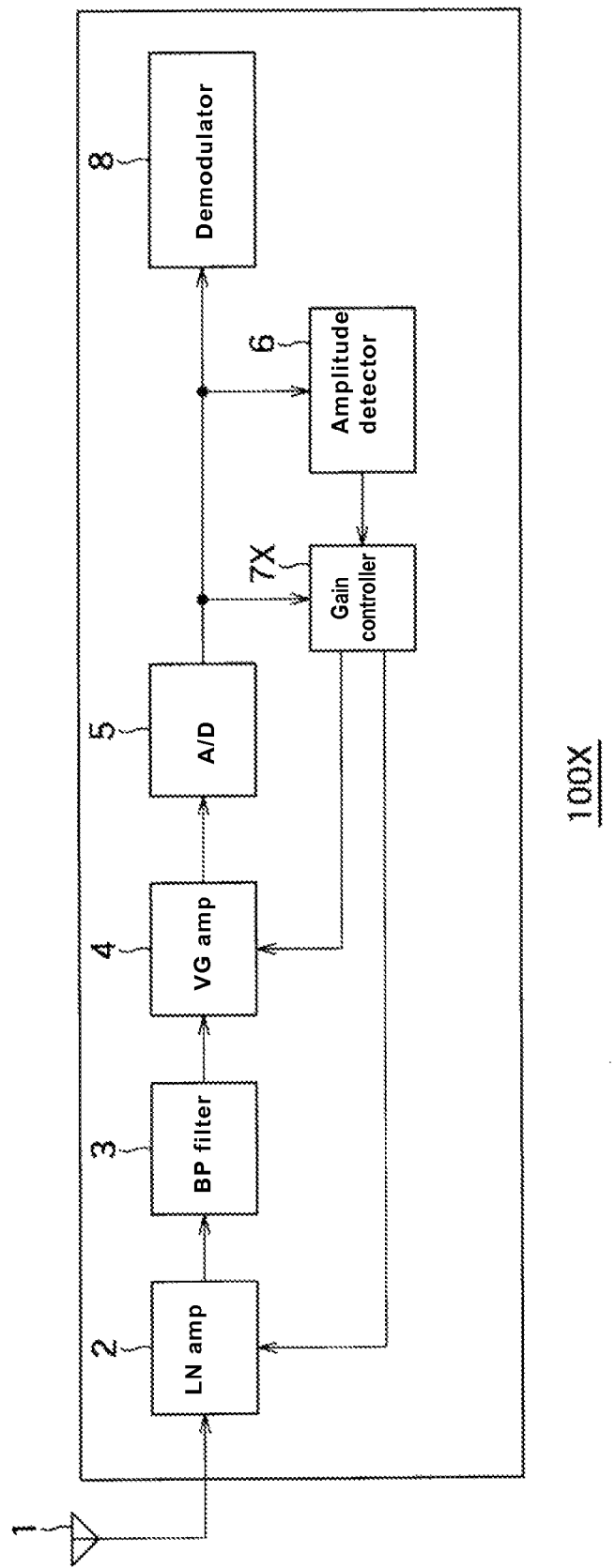
FIG. 5 is a conceptual diagram illustrating a configuration of a reception device in a comparative example.

FIG. 5 is a conceptual diagram illustrating a configuration of a reception device 100X in a comparison example. The reception device 100X differs from the reception device 100 of the first embodiment in that the reception device 100X is not provided with the saturation detection unit 9 and because the function of an automatic gain controller 7X differs from the function of the automatic gain controller 7 according to the first embodiment. The automatic gain controller 7X, when the amplitude of a radio signal exceeds a predetermined threshold value, controls a first gain and a second gain corresponding to the amplitude of the radio signal, and completes the control within a gain control period. The automatic gain controller 7X does not re-control the first gain and the second gain. Other configurations are identical with the corresponding configurations of the first embodiment and, hence, the same symbols are given to identical elements and the explanation of these elements is omitted.

Figure 6:
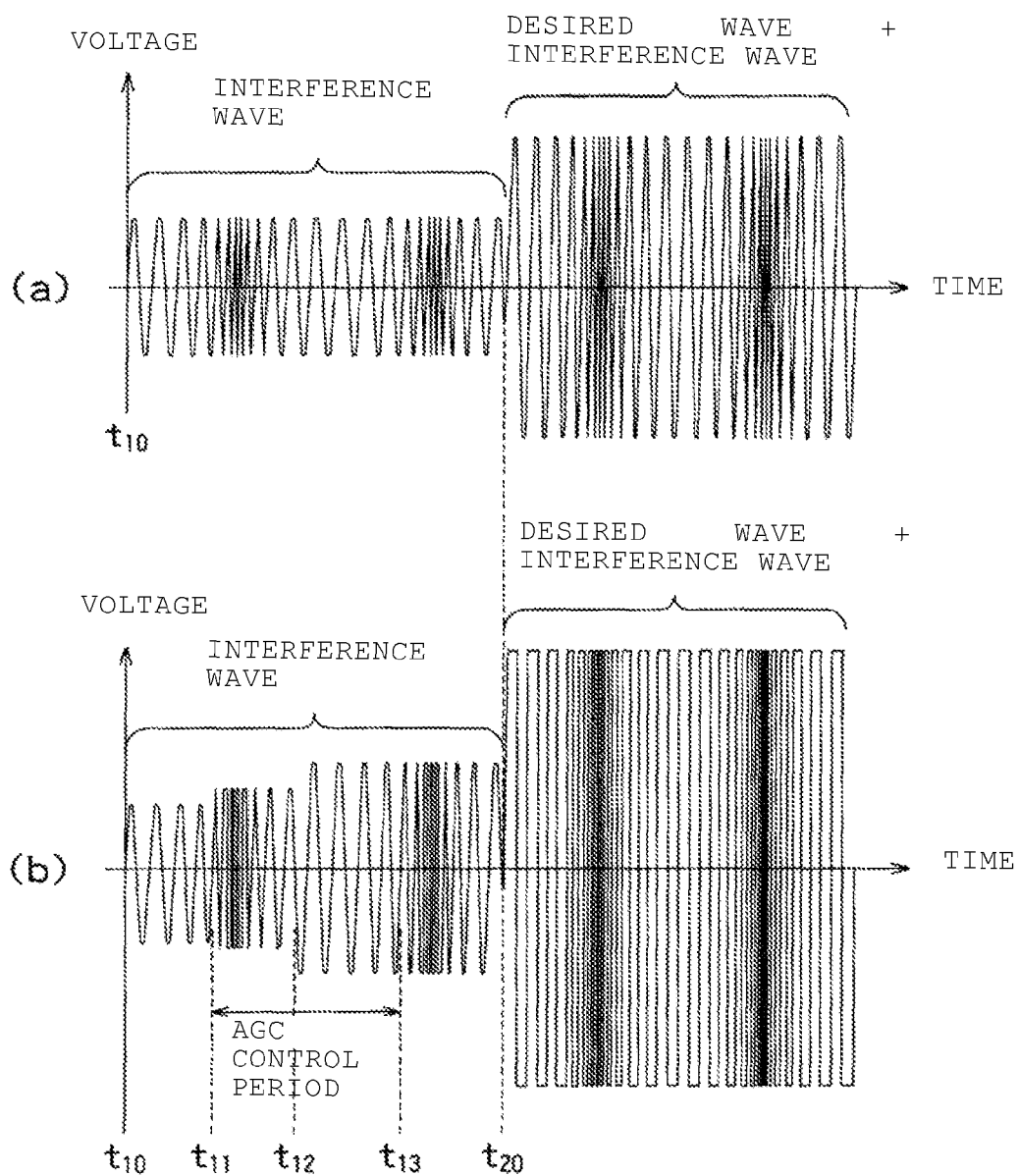

FIG. 6(*a*) and FIG. 6(*b*) are waveform charts, in which FIG. 6(*a*) is a waveform chart illustrating a waveform of a radio signal input to an antenna 1 of the reception device 100X in FIG. 5, FIG. 6(*b*) is a waveform chart illustrating a waveform of a digital signal based on the radio signal in (FIG. 6(*a*). FIG. 6(*a*) illustrates the same waveform as the waveform in FIG. 4(*a*), and the digital signal from the point in time t10 to the point in time t20 in FIG. 6(*b*) has the same waveform as the digital signal from the point in time t10 to the point in time t20 in FIG. 4(*b*).

As illustrated in FIG. 6(*b*), when a desired wave is input in addition to an interference wave at the point in time t20, the amplitude of a digital signal is saturated. The automatic gain controller 7X does not control the first gain and the second gain when the gain control period finishes. Accordingly, after the point in time t20, the waveform of the digital signal maintains as a square wave. Accordingly, frequency information which a radio signal input to the antenna 1 contains changes in the digital signal and, hence, data 13 or the like acquired by the demodulation unit 8 differs from the frequency information contained in the radio signal. That is, in the reception device 100X of the comparison example, the reception performance deteriorates. As described previously, the reception device 100 of the first embodiment overcomes this drawback.

Second Embodiment

The second embodiment differs from the first embodiment with respect to how the first gain and the second gain are controlled when saturation is detected.

A reception device 100 according to the second embodiment differs from the reception device 100 according to the first embodiment with respect to a function of the automatic gain controller 7. Other configurations of the reception device 100 according to the second embodiment are identical to the corresponding configurations according to the first embodiment and, hence, the same symbols are given to identical elements and explanation of these elements is omitted.

The automatic gain controller 7, when amplitude of a radio signal exceeds a threshold value, changes a first gain and a second gain in accordance with a predetermined control rule such that the amplitude of a digital signal approximates a target value. That is, in this embodiment, the automatic gain controller 7 is operated in the same manner as the first embodiment.

On the other hand, when the control of the first gain and the second gain completes a first time, the demodulation unit 8 does not acquire a destination address 12 corresponding to the own device, and saturation is detected by a saturation detection unit 9, the automatic gain controller 7 lowers a sum of the present first gain and the present second gain until the amplitude which the digital signal expresses approximates a target value.

In this manner, the automatic gain controller 7 performs the operation in accordance with control rules at the time of the first controlling of the first gain and the second gain which differ from control rules used at the time of re-controlling the first gain and the second gain.

Figure 7:
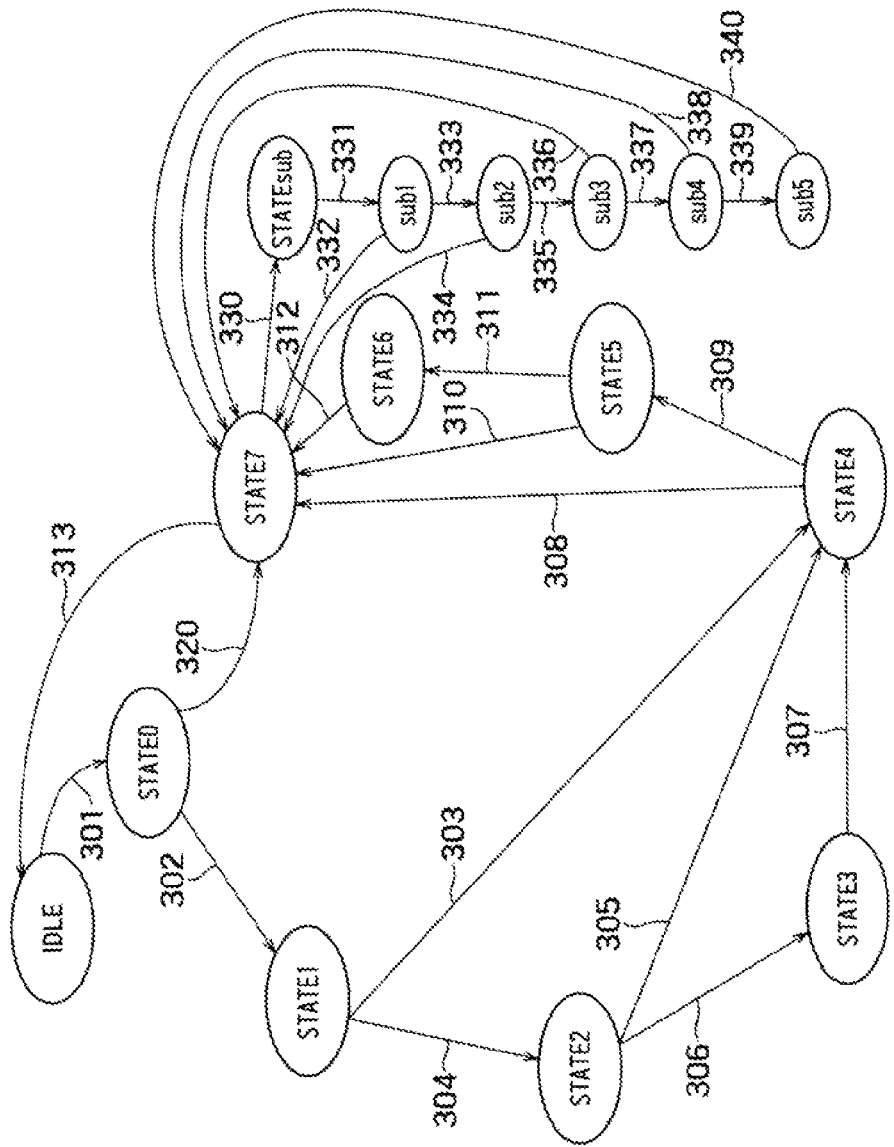
FIG. 7 is a state transition diagram of a reception device according to a second embodiment.

FIG. 7 is a state transition view of the reception device 100 according to the second embodiment. The respective transitions among an IDLE state, and states STATE0 to STATE7 are equivalent to the corresponding transitions in the first embodiment. Hereinafter, the explanation focuses on the differences between the first embodiment and the second embodiment.

In STATE7, when a destination address 12 corresponding to the own device is not acquired by the demodulation unit 8, and saturation is detected by the saturation detection unit 9, the reception device 100 transitions to a STATE sub (330), and the automatic gain controller 7 re-controls the first gain and the second gain.

First, in the STATE sub, the automatic gain controller 7 lowers a sum of the present first gain and the present second gain by one stage so that the reception device 100 transitions to sub1 (331). The automatic gain controller 7 may lower the second gain by one stage, for example. There may be a case where the second gain is the lowest gain so that the second gain is not lowered. In such a case, for example, the first gain may be lowered by one stage after the second gain is increased to the largest gain.

In state sub1, when the amplitude of a digital signal falls within a second predetermined value from a target value, the automatic gain controller 7 determines that the first gain and the second gain are optimal gains, and the reception device 100 transitions to STATE7 (332). On the other hand, when the amplitude of the digital signal differs from the target value by the second predetermined value or more, the automatic gain controller 7 further lowers the sum of the first gain and the second gain by one stage, and the reception device 100 transitions to sub2 (333).

The substantially same operation is performed in states sub2 to sub4. When the amplitude of a digital signal falls within a second predetermined value from a target value, the automatic gain controller 7 determines that the first gain and the second gain are optimal gains, and the reception device 100 transitions to STATE7 (334, 336, 338). On the other hand, when the amplitude of the digital signal differs from the target value by the second predetermined value or more, the automatic gain controller 7 further lowers the sum of the first gain and the second gain by one stage, and the reception device 100 transitions to sub 3, sub4 or sub5 (335, 337, 339).

In state sub 5, the automatic gain controller 7 further lowers the sum of the first gain and the second gain by one stage, and the reception device 100 transitions to STATE7 (340).

In the embodiment illustrated in FIG. 7, five states ranging from sub 1 to sub 5 are illustrated. However, the number of states may be increased or decreased.

In this manner, according to this embodiment, at the time of re-controlling the first gain and the second gain, the automatic gain controller 7 lowers the sum of the present first gain and the present second gain until the amplitude of the digital signal approximates the target value. Accordingly, it is unnecessary to increase the first gain or the second gain once and, hence, the re-control of the first gain and the second gain may be completed within a shorter time than the first embodiment.

In the first embodiment, in case of the control rule where the first gain is set to the maximum gain in STATE1, when the first gain at the point in time t20 is smaller than the maximum gain, the reception device 100 transitions to STATE1 again and hence, the first gain is increased once. In case of the re-control, it is unnecessary to increase the first gain. Accordingly, the transition to the STATE1 is wasteful. That is, unnecessary waste of time occurs in the re-control. However, in the first embodiment, the automatic gain controller 7 follows the same control rule between the time of the first controlling of the first gain and the second gain and at the time of re-controlling the first gain and the second gain. Hence, the configuration of the first embodiment is simpler than the second embodiment.

Third Embodiment

In the third embodiment, saturation is detected based on a signal which differs from the signal used in the first embodiment.

Figure 8:
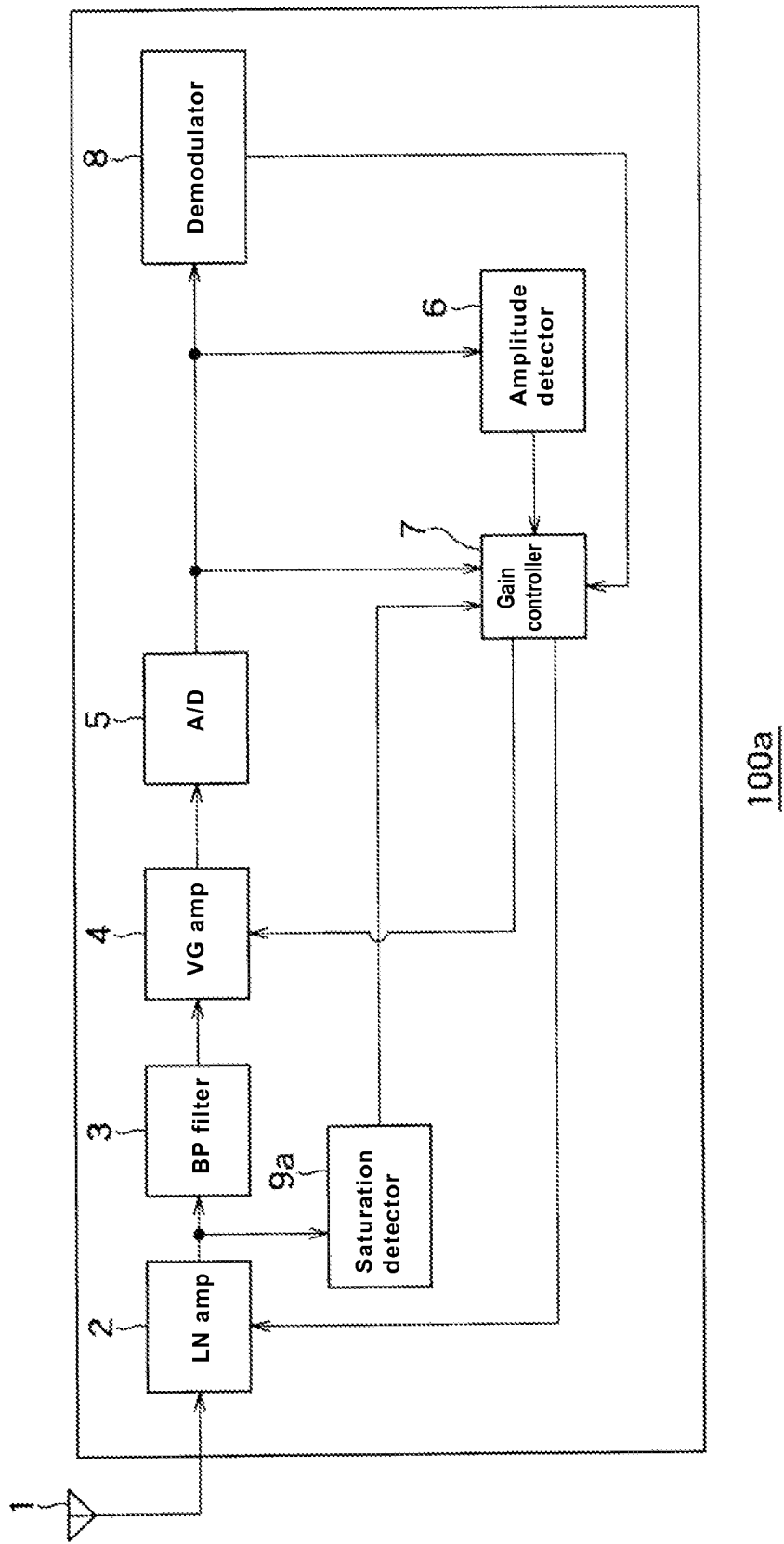
FIG. 8 is a conceptual diagram illustrating a configuration of a reception device according to a third embodiment.

FIG. 8 is a conceptual diagram illustrating a configuration of a reception device 100a according to the third embodiment. In FIG. 8, components that are in common with the components illustrated in FIG. 1 are given the same symbols, and the explanation of the third embodiment focuses on the differences between the first embodiment and the third embodiment.

A saturation detection unit 9a detects saturation of a band pass filter 3, that is, saturation of an analog-to-digital converter 5 based on an output signal of a low noise amplifier 2. When an output signal of the low noise amplifier 2 becomes excessively large, the band pass filter 3 and the variable gain amplifier 4 saturate and, as a result, the analog-to-digital converter 5 also saturates.

For example, when an output signal of the low noise amplifier 2 exceeds a predetermined saturation detection threshold value, the saturation detection unit 9a detects saturation of the analog-to-digital converter 5. Such detection may be performed using a comparator, which is an analog circuit.

According to this embodiment, advantageous effects substantially equal to those achieved in the first embodiment may be observed.

The third embodiment may be combined with the second embodiment.

According to at least one of embodiments explained herein, owing to the provision of the saturation detection unit 9, saturation detection unit 9a, and the automatic gain controller 7, it is possible to prevent the deterioration of the reception performance of the reception device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A reception device comprising:
a low noise amplifier configured to amplify a radio signal received by an antenna by a first gain;
a variable gain amplifier configured to amplify an output signal of the low noise amplifier by a second gain;
an analog-to-digital converter configured to convert an output signal of the variable gain amplifier into a digital signal;
a gain controller configured to control, when an amplitude of the radio signal exceeds a predetermined threshold value, the first gain and the second gain corresponding to the amplitude of the radio signal the gain controller in accordance with a predetermined control rule such that an amplitude of the digital signal approximates a target value, when the amplitude of the radio signal exceeds the threshold value, and to complete the controlling within a predetermined gain control period;
a saturation detection unit configured to detect saturation of the analog-to-digital converter based on the output signal of the low noise amplifier or the digital signal; and
a demodulation unit configured to demodulate the digital signal and to acquire thereby a destination address contained in the radio signal, wherein
if the acquired destination address does not correspond to the reception device and the saturation is detected by the saturation detection unit after controlling the first gain and the second gain within the predetermined gain control period, the gain controller controls the first gain and the second gain a second time to adjust the amplitude of the radio signal such that a sum of the first gain and the second gain is lowered until an amplitude of the digital signal approximates the target value.

2. The reception device according to claim 1, wherein, if the amplitude of the radio signal exceeds the threshold value, the acquired destination address does not correspond to the reception device, and saturation is detected by the saturation detection unit, the gain controller, after controlling the first gain and the second gain within the predetermined gain control period, changes the first gain and the second gain in accordance with another predetermined control rule such that an amplitude of the digital signal approximates the target value.

3. The reception device according to claim 1, wherein the radio signal contains a preamble and a destination address, and
the gain control period is shorter than a period of the preamble.

4. The reception device according to claim 1, further comprising a band pass filter configured to remove frequency components from an output signal of the low noise amplifier.

5. The reception device according to claim 4, further comprising an amplitude detection unit configured to detect an amplitude level of the radio signal and to determine whether the detected amplitude level exceeds the predetermined threshold value.

6. The reception device according to claim 5, wherein the amplitude detection unit detects the amplitude level of the radio signal during a period that is shorter than the period of the preamble, said period preceding the gain control period.

7. The reception device according to claim 6, wherein the amplitude detection unit detects the amplitude level of the radio signal based on the digital signal.

8. A method of receiving and amplifying a radio signal using a reception device, the reception device including an antenna, a low noise amplifier, a variable gain amplifier, and an analog-to-digital converter, the method comprising:
receiving the radio signal, wherein the radio signal includes a preamble and a destination address;
controlling, at a first time, a first gain and a second gain corresponding to an amplitude of the radio signal, wherein said controlling is completed within a predetermined gain control period smaller than a period of the preamble;
amplifying the radio signal by a first gain to produce a first amplified radio signal;
amplifying the first amplified radio signal by a second gain to produce a second amplified radio signal;
converting, by an analog-to-digital converter, the second amplified radio signal into a digital signal;
demodulating the digital signal;
acquiring a destination address from the demodulated digital signal;
detecting a saturation of the analog-to-digital converter based on the digital signal; and
if the saturation is detected and the acquired destination address does not correspond to the reception device, then controlling the first gain and the second gain a second time based on the amplitude of the radio signal.

9. The method of claim 8, further comprising:
detecting an amplitude of the digital signal;
determining the amplitude of the radio signal based on the amplitude of the digital signal,
wherein the first gain and the second gain corresponding to the amplitude of the radio signal are controlled the second time if the amplitude of the radio signal exceeds a predetermined threshold value.

10. The method of claim 8, further comprising filtering the first amplified radio signal to remove frequency components thereof.

11. The method of claim 8, wherein said controlling of the first gain and the second gain for the second time comprises changing the first gain and the second gain in accordance with a predetermined control rule such that an amplitude of the digital signal approximates a target value.

12. The method of claim 8, wherein said controlling of the first gain and the second gain for the second time comprises adjusting the first gain and the second gain such that a sum of the first gain and the second gain is lowered until an amplitude of the digital signal approximates a target value.

13. A gain controlling device included in a radio signal receiver, the gain controlling device configured to:
receive a first input from a saturation detection unit indicating that saturation of a radio signal has been detected;
receive a second input from a demodulator indicating that a destination address acquired from the radio signal does not correspond to the radio signal receiver; and
responsive to receiving the first and the second inputs:
adjust a first gain of a low noise amplifier configured to perform a first amplification of the radio signal, and
adjust a second gain of a variable gain amplifier configured to perform a second amplification of the radio signal, wherein the first and second gains are adjusted until the amplitude of the radio signal is a target value.

14. The gain controlling device according to claim 13, further configured to:
receive a third input from an amplitude detection unit indicating that an amplitude of the radio signal exceeds a predetermined threshold; and
responsive to receiving the third input:
adjust the first gain of the low noise amplifier; and
adjust the second gain of the variable gain amplifier, wherein the first and second gains are adjusted until the amplitude of the radio signal is the target value.

* * * * *